(12) United States Patent
Parks

(10) Patent No.: US 7,915,702 B2
(45) Date of Patent: Mar. 29, 2011

(54) REDUCED PIXEL AREA IMAGE SENSOR

(75) Inventor: Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 716 days.

(21) Appl. No.: 11/686,573

(22) Filed: Mar. 15, 2007

(65) Prior Publication Data

US 2008/0225148 A1 Sep. 18, 2008

(51) Int. Cl.
*H01L 31/101* (2006.01)
(52) U.S. Cl. ............... 257/462; 257/E31.053; 362/396; 439/328
(58) Field of Classification Search ......... 257/462, 257/E31.053; 362/396; 439/328
See application file for complete search history.

(56) References Cited

U.S. PATENT DOCUMENTS

| | | | |
|---|---|---|---|
| 5,625,210 A | 4/1997 | Lee et al. | |
| 5,841,159 A | 11/1998 | Lee et al. | |
| 5,903,021 A * | 5/1999 | Lee et al. | 257/292 |
| 5,949,061 A | 9/1999 | Guidash et al. | |
| 6,107,655 A * | 8/2000 | Guidash | 257/233 |
| 6,160,281 A | 12/2000 | Guidash | |
| 6,323,476 B1 * | 11/2001 | Guidash et al. | 250/208.1 |
| 6,423,994 B1 | 7/2002 | Guidash | |
| 6,657,665 B1 | 12/2003 | Guidash | |
| 6,731,336 B1 | 5/2004 | Shinohara | |
| 7,569,868 B2 | 8/2009 | Watanabe et al. | |
| 2003/0151569 A1 * | 8/2003 | Lee et al. | 345/84 |
| 2006/0231739 A1 | 10/2006 | Sekine et al. | |

FOREIGN PATENT DOCUMENTS

| EP | 0 757 475 | 2/1997 |
|---|---|---|
| EP | 1 713 250 | 10/2006 |

* cited by examiner

*Primary Examiner* — Evan Pert
*Assistant Examiner* — Eduardo A Rodela
(74) *Attorney, Agent, or Firm* — Nancy R. Simon

(57) ABSTRACT

An image sensor that includes a plurality of pixels disposed on a substrate, each pixel includes at least one photosensitive region that collects charges in response to incident light; a charge-to-voltage conversion node for sensing the charge from the at least one photosensitive region and converting the charge to a voltage; an amplifier transistor having a source connected to an output node, having a gate connected to the charge-to-voltage conversion node and having a drain connected to at least a portion of a power supply node; and a reset transistor connecting the output node and the charge-to-voltage conversion node.

8 Claims, 6 Drawing Sheets

REDUCED PIXEL AREA IMAGE SENSOR

FIELD OF THE INVENTION

The invention relates generally to the field of CMOS active pixel image sensors and, more particularly, to reducing the size of a pixel.

BACKGROUND OF THE INVENTION

FIG. 1 shows the typical CMOS active pixel image sensor 100. The basic component of the image sensor 100 is the array of photosensitive pixels 130. The row decoder circuitry 105 selects an entire row of pixels 130 to be sampled by the correlated double sampling (CDS) circuitry 125. The analog-to-digital converter 115 scans across the column decoders and digitizes the signals stored in the CDS 125. The analog-to-digital converter 115 may be of the type which has one converter for each column (parallel) or one high-speed converter to digitize each column serially. The digitized data may be directly output from the image sensor 100 or there may be integrated image processing 120 for defect correction, color filter interpolation, image scaling, and other special effects. The timing generator 110 controls the row and column decoders to sample the entire pixel array or only a portion of the pixel array.

FIG. 2 shows one of many different possible schematics for a CMOS image sensor. Four pixels 130 (only one is labeled for clarity) are shown of the pixel array. Each pixel 130 has circuitry that is shared between two photodiodes 150 and 151. This type of pixel along with other variations may be found in U.S. Pat. Nos. 5,625,210; 5,841,159; 5,949,061; 6,107,655; 6,160,281; 6,423,994; and 6,657,665.

The photodiodes 150 and 151 are connected to a common shared floating diffusion 155 respectively by transfer gates 152 and 153. The process of sampling the photodiode 150 begins by turning on the power supply (VDD) 158 and also turning on the reset transistor 154 to set the floating diffusion 155 voltage to the voltage of the power supply 158. The reset transistor 154 is then turned off, and the signal level sampled by the output transistor 156 is driven onto the output signal line 157. Next, the transfer gate 153 is turned on to transfer photo-generated signal charge from photodiode 150 to the floating diffusion 155. Now the output transistor 156 will drive the signal level voltage onto the output signal line 157. The difference of the first signal just after reset minus the signal after the transfer gate 153 was pulsed is proportional to the number of electrons that was in the photodiode 150.

The second photodiode 151 is sampled in the same manner through transfer gate 152. This pixel 130 is shown as a two-shared pixel because two photodiodes 150 and 151 share a common floating diffusion 155. An example of how a two-shared pixel might physically be manufactured on a silicon substrate is shown in FIG. 3. The numbered components in FIG. 3 correspond to the schematic symbols in FIG. 2. The polysilicon transistors transfer gates are 152 and 153; the reset transistor gate is 154 and the output transistor gate is 156. The floating diffusion contacts 155 are connected together by a metal wire. The reset 154 and output 156 transistors share a common diffusion connection 158 to the power supply line.

The drawback with the pixel layout of FIG. 3 is how to reduce the size of the pixel. The gap 160 between two adjacent pixels cannot be shrunk further without risking leakage of electrons between to adjacent pixels. The size of the transistor gates 154 and 156 cannot shrink because the operating voltage of the power supply determines their size. Reducing the power supply voltage is not an attractive option because that also will reduce the maximum number of photo-electrons that can be collected by the photodiodes.

The present invention will address this shortcoming and others as it discloses a way to reduce the pixel size without having to reduce the size of the reset and output transistor gates.

SUMMARY OF THE INVENTION

The present invention is directed to overcoming one or more of the problems set forth above. Briefly summarized, according to one aspect of the present invention, the invention resides in an image sensor that includes a plurality of pixels disposed on a substrate, each pixel includes at least one photosensitive region that collects charges in response to incident light; a charge-to-voltage conversion node for sensing the charge from the at least one photosensitive region and converting the charge to a voltage; an amplifier transistor having a source connected to an output node, having a gate connected to the charge-to-voltage conversion node and having a drain connected to at least a portion of a power supply node; and a reset transistor connecting the output node and the charge-to-voltage conversion node.

ADVANTAGEOUS EFFECT OF THE INVENTION

The invention allows for reducing an image sensor pixel size without reducing the size of the transistor geometry.

DETAILED DESCRIPTION OF THE INVENTION

Before discussing the present invention in detail, it is instructive to note that the present invention is preferably used in, but not limited to, a CMOS active pixel sensor. Active pixel sensor refers to an active electrical element within the pixel, more specifically the amplifier, and CMOS refers to complementary metal oxide silicon type electrical components such as transistors which are associated with the pixel, but typically not in the pixel, and which are formed when the source/drain of a transistor is of one dopant type (p-type for example) and its mated transistor is of the opposite dopant type (n-type). CMOS devices include some advantages one of which is it consumes less power.

Figure 4:
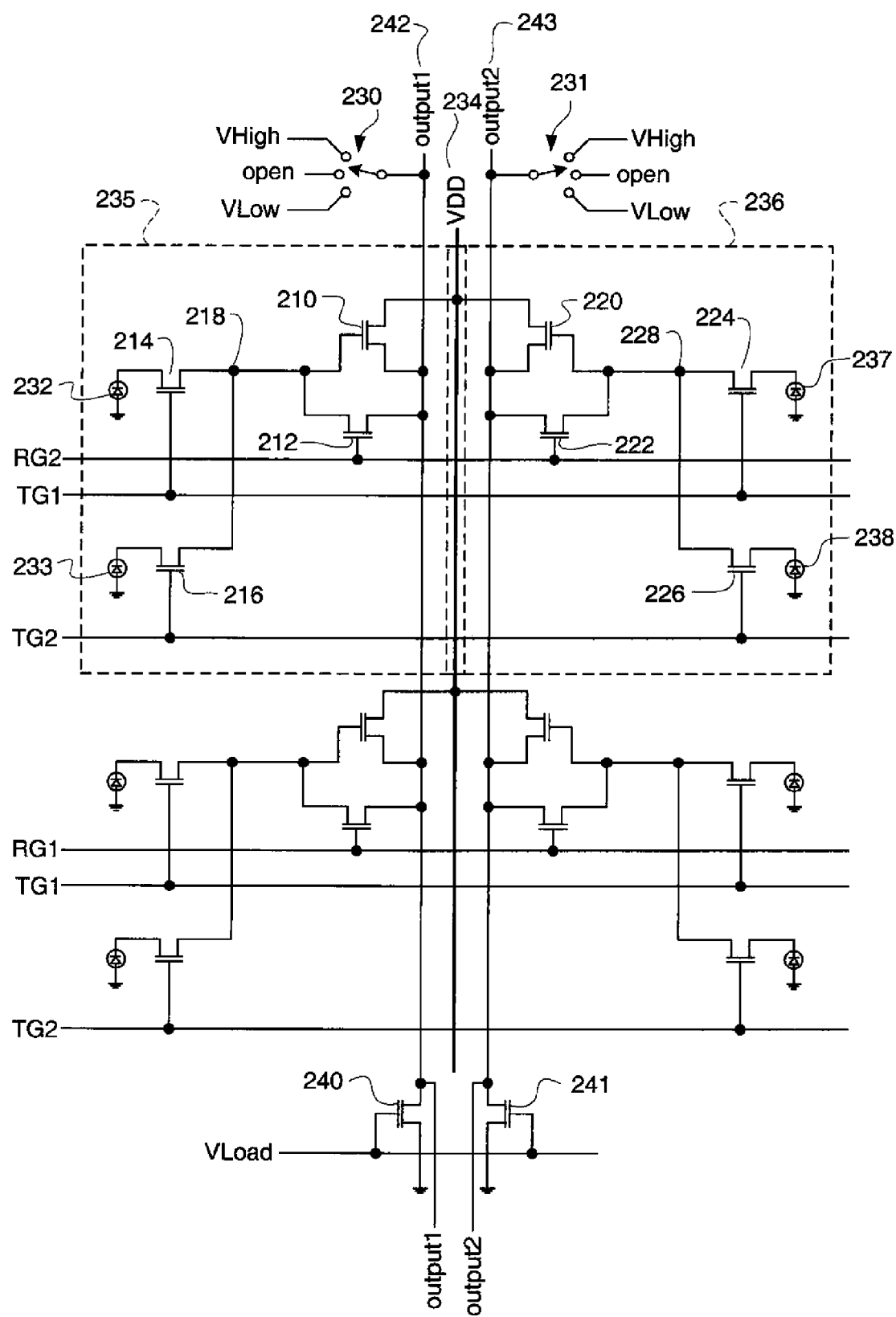
FIG. 4 is a schematic diagram of a plurality of pixels of the present invention.

To reduce the pixel size, it is necessary to change the operation of the transistors in the pixels. The schematic for the pixel of the present invention is shown in FIG. 4. The primary difference of this pixel 235 from the prior art is the reset transistor 212 is connected between the floating diffusion 218 and the output signal line 242. The prior art would have connected the reset transistor to the power supply line (VDD) 234. While this schematic does not reduce the total number of transistors, it does allow the power supply line (VDD) 234 diffusions to be shared between two pixels 235 and 236. This is more clearly shown in FIG. 5.

Referring back to FIG. 4, each pixel will now be described in detail. Pixel 235 will be used as a representative pixel. In this regard, pixel 235 includes two photosensitive areas or photodiodes 232 and 233 each for collecting charge in response to incident light. It is noted for clarity that pinned photodiodes could also be used as it is understood that this feature needs primarily to just collect charge in response to light. Transfer gate 214 transfers the charge from the photodiode 232 to the charge-to-voltage conversion node or sense node 218. An output transistor or amplifier 210, preferably a source follower, is connected to the sense node 218 via its gate, and the amplifier 210 senses the signal on the sense node 218 and outputs the signal on an output bus 242 via its source. The drain of the amplifier 210 is connected to the power supply (VDD) 234. This connection includes connecting the drain to at least a portion of the power supply node 234. This portion preferably includes one half or substantially one half of the power supply node 234. Amplifier 220 is connected in the same manner and is connected to the remaining portion of the power supply 234. Pixel 235 shares the sense node 218, amplifier 210 and reset transistor 212, but includes a separate photodiode 233 that collects charge in response to incident light and transfer gate 216 that transfers the charge to the sense node 218.

An adjacent pixel 236 includes the same components as pixel 235, but are numbered differently for clarity. In this regard, pixel 236 includes a photodiode 237, transfer gate 224, sense node or floating diffusion 228, amplifier 220 and reset transistor 222. Pixel 236 shares the floating diffusion 228, amplifier 220 and reset transistor 222, but includes a separate photodiode 238 and transfer gate 226.

Figure 5:
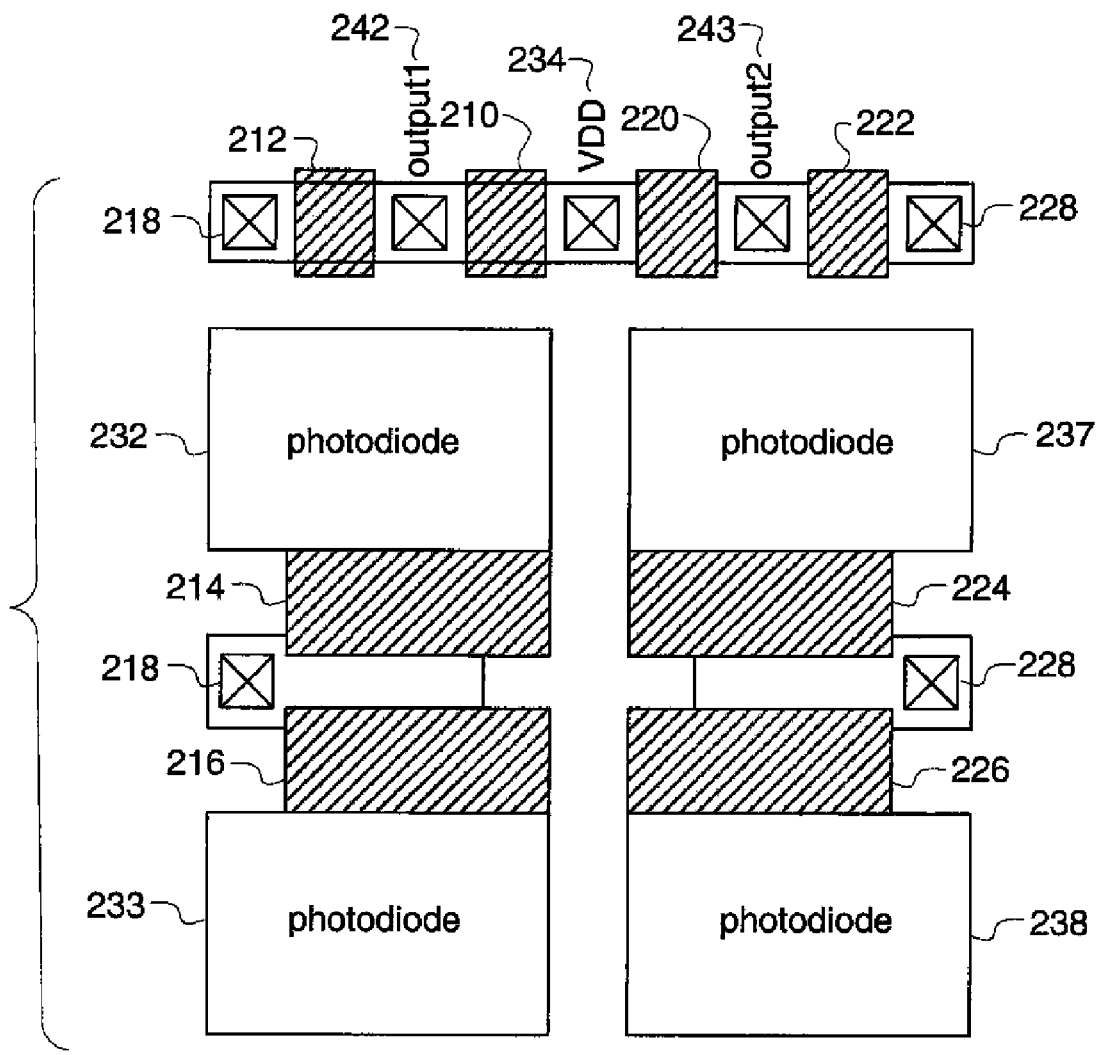
FIG. 5 is a plan view (top view) of FIG. 4.

In FIG. 5, the reference numerals correspond to the numerals in FIG. 4. The VDD diffusion 234 is shared between the two output transistors 210 and 220. The reset transistor gates 212 and 222 allow the floating diffusions 218 and 228 to be reset to a voltage through the outputs 242 and 243. Pixel 235 (shown in FIG. 4) includes a sequential spatial order as follows: the charge-to-voltage conversion node 218, a reset gate of the reset transistor 212, the output node 242, a gate of the amplifier transistor 210 and at least a portion of the power supply node 234. The adjacent pixel 236 (also shown in FIG. 4) includes a sequential spatial order as follows: a remaining portion of the power supply node 234, a gate of the amplifier transistor 220, the output node 243, a reset gate of the reset transistor 222, and a charge-to-voltage conversion node 228.

Referring back to FIG. 4, the process of reading out charge from the row of photodiodes 232 and 237 begins by activating the floating diffusions 218 and 228. This is done by turning off the constant current sink load transistors 240 and 241 (see bottom of FIG. 4). With the load transistors 240 and 241 off, the switches 230 and 231 can be set to the VHigh voltage setting. Now when the reset transistors 212 and 222 are turned on, the floating diffusions 218 and 228 will be set to the VHigh voltage. Next, the reset transistors 212 and 222 are turned off and the switches 230 and 231 are set to the open setting. Then the current sink load transistors 240 and 241 are turned on so the output transistors 210 and 220 will drive the output lines 242 and 243 to a voltage representing the floating reset level corresponding to zero electrons of photo-signal. Next, the transfer gates 214 and 224 are pulsed on and off to transfer the photo-generated charge from the photodiodes 232 and 237 to the floating diffusions 218 and 228. Now the output transistors 210 and 220 will drive the output lines 242 and 243 to a voltage level corresponding to the number of electrons generated in the photodiodes 232 and 237. The difference between this voltage level and the reset voltage level is proportional to the amount of charge in the photodiodes.

To read out the next row of photodiodes 233 and 238 the process is repeated by activating the floating diffusions 218 and 228. This is done by turning off the constant current sink load transistors 240 and 241. With the load transistors 240 and 241 off, the switches 230 and 231 can be set to the VHigh voltage setting. Now when the reset transistors 212 and 222 are turned on, the floating diffusions 218 and 228 will be set to the VHigh voltage. Next, the reset transistors 212 and 222 are turned off and the switches 230 and 231 are set to the open setting. Then the current sink load transistors 240 and 241 are turned on so the output transistors 210 and 220 will drive the output lines 242 and 243 to a voltage representing the floating reset level corresponding to zero electrons of photo-signal. Next the transfer gates 216 and 226 are pulsed on and off to transfer the photo-generated charge from the photodiodes 233 and 238 to the floating diffusions 218 and 228. Now the output transistors 210 and 220 will drive the output lines 242 and 243 to a voltage level corresponding to the number of electrons generated in the photodiodes 233 and 238. The difference between this voltage level and the reset voltage level is proportional to the amount of charge in the photodiodes.

Next the transistors in pixels 235 and 236 must be deactivated before moving on to read out another row of pixels. Holding the reset transistors 212 and 222 in the on state sets the gate and source voltages equal of the output transistors 210 and 220. When the gate and source voltages are equal in a surface channel transistor the transistors will be in the off state. When the output transistors 210 and 220 are in the off state, they will not interfere with reading out photodiodes of other image sensor rows.

Figure 1:
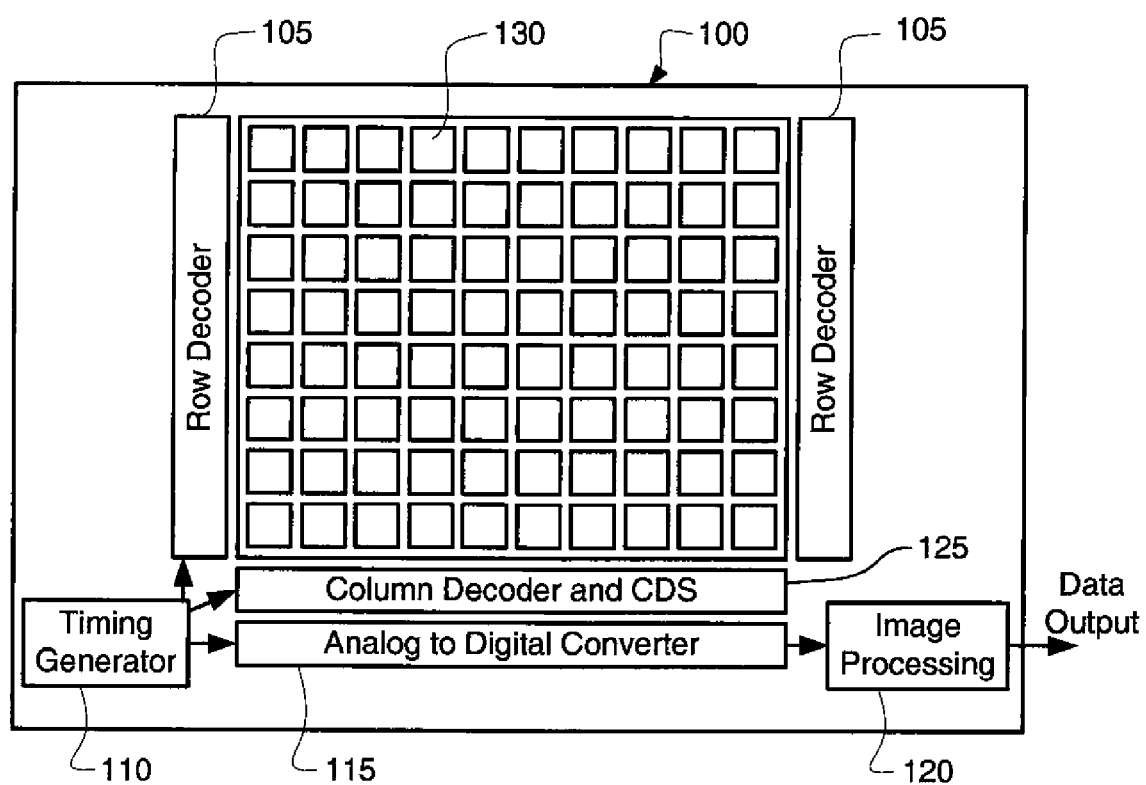
FIG. 1 is a prior art active pixel image sensor.
Figure 2:
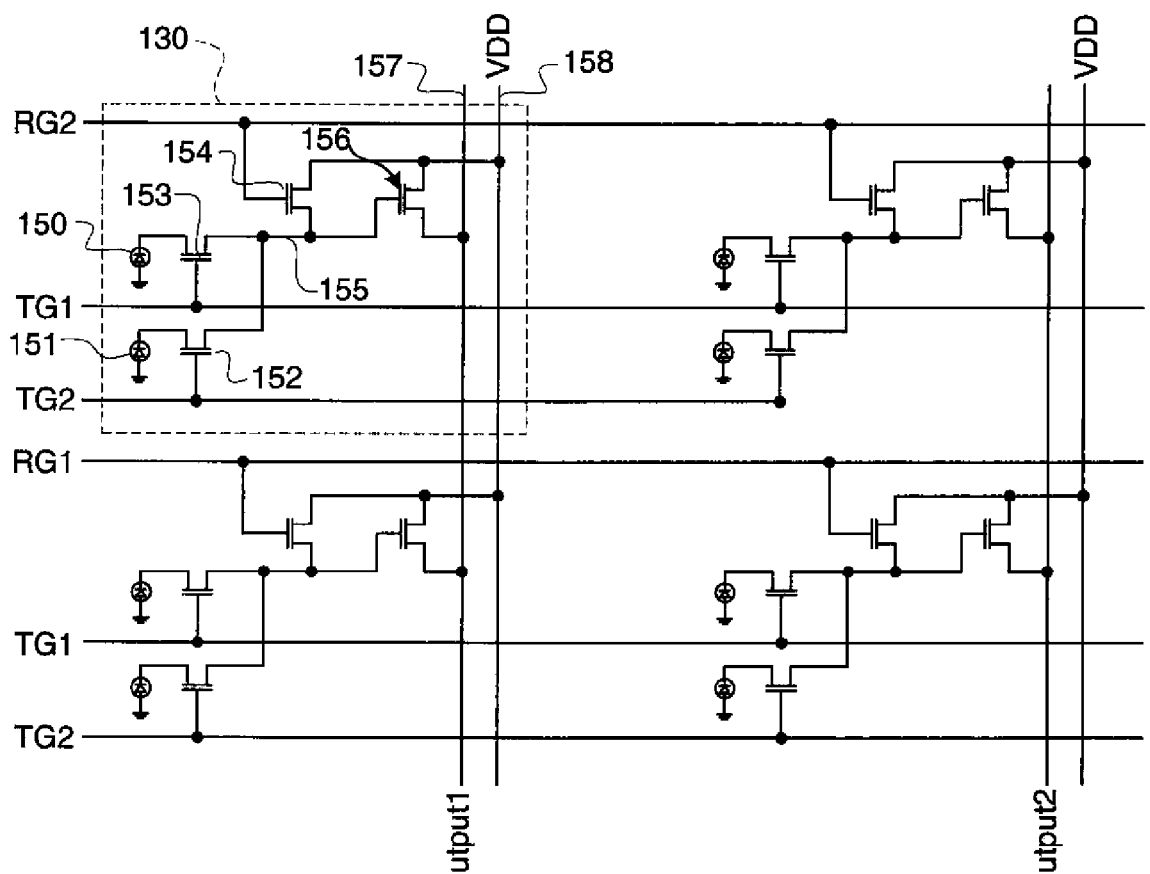
FIG. 2 is a schematic diagram of a pixel of FIG. 1.
Figure 3:
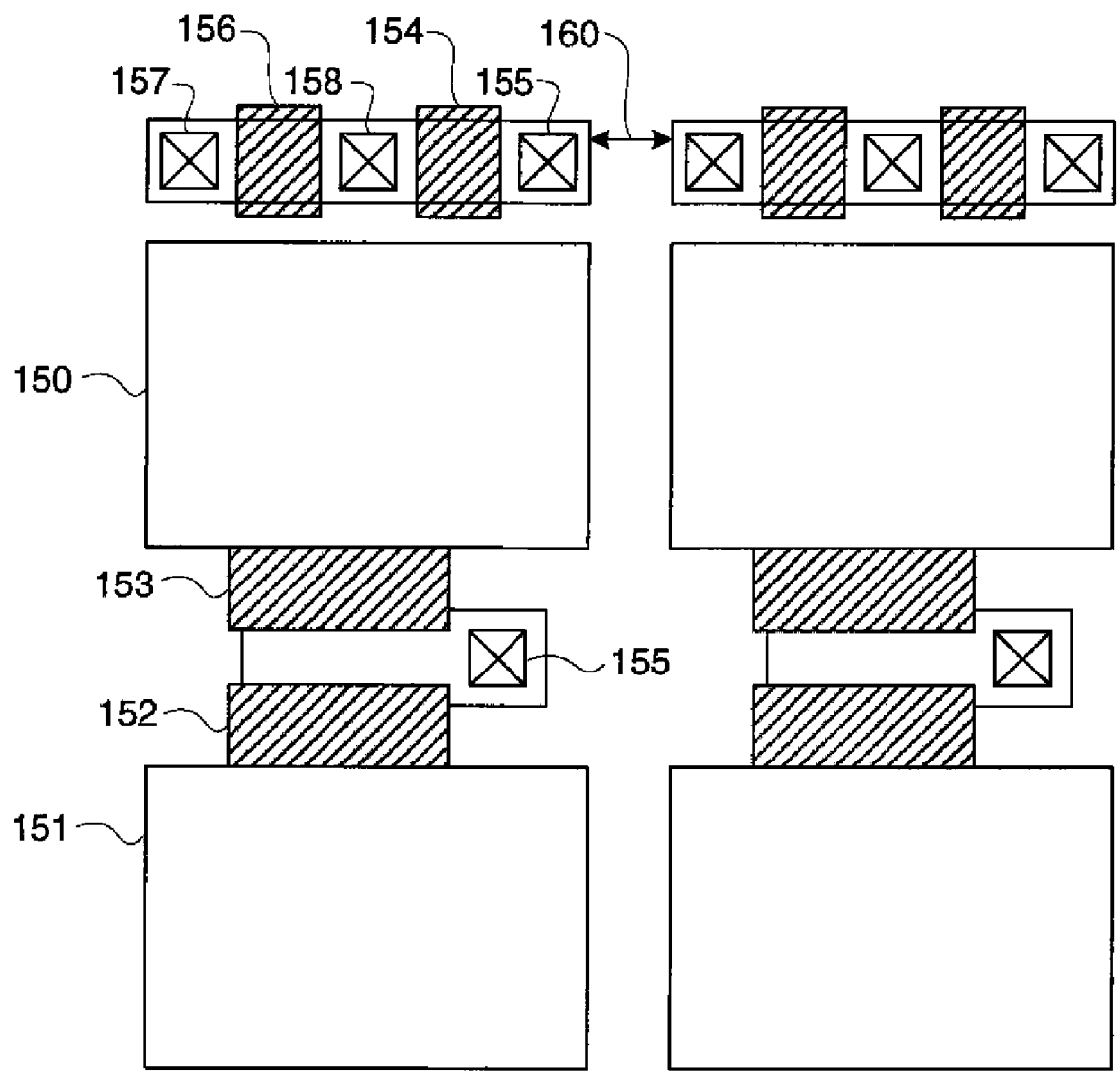
FIG. 3 is a plan view (top view) of FIG. 1.

By sharing a common power supply (VDD) diffusion 234, the amount of area occupied by the transistors is reduced in FIG. 5. Compared to the prior art in FIG. 3 there is one less contact and one less isolation region between transistors. This allows the overall pixel size to be reduced while maintaining the same transistor gate dimensions and maintaining reasonable sized photodiodes.

Figure 6:
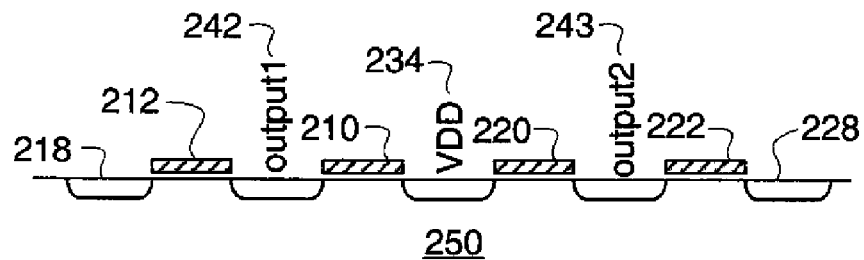
FIG. 6 a horizontal cross-section through the transistors of FIG. 5.

FIG. 6 shows a cross section through the line of transistor gates 212, 210, 220, and 222. The transistors are fabricated in a silicon substrate 250.

The pixel 235 in FIG. 4 shows two photodiodes 232 and 233 that share a common floating diffusion 218. Those skilled in the art of CMOS image sensors will easily observe the invention can be applied to any number of photodiodes sharing or not sharing a common floating diffusion, including the case of no shared photodiodes.

FIG. 4 also shows the VDD power supply line 234 oriented in the vertical direction. The power supply line 234 can also be oriented horizontally or in both directions as a square grid. Furthermore, if the VDD power supply line 234 is oriented horizontally it can be used to select or de-select rows for read out as in U.S. Pat. Nos. 5,949,061 and 6,323,476.

Figure 7:
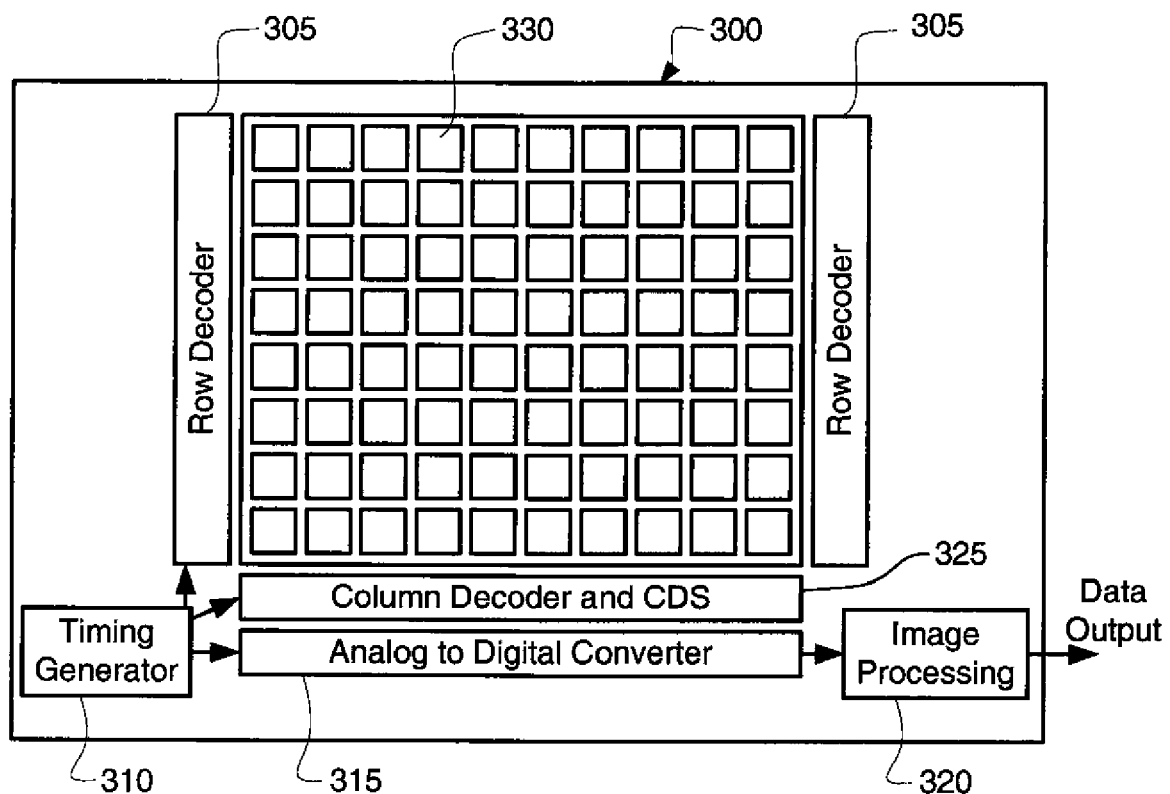
FIG. 7 is the image sensor of the present invention having the pixels of FIG. 4.

FIG. 7 shows the pixel of the present invention 330 incorporated into an image sensor 300. The image sensor 300 has row decoders 305 selecting and de-selecting rows for read out. It also has column decoders 325 for sampling the output lines of each column and an analog-to-digital converter 315 to digitize the signal on the output lines. The timing generator 310 controls the scanning of the row 305 and column 325 decoders. The image processor 320 is used to correct row and column gain and offsets as well as defected correction and color filter interpolation or other image processing functions.

Figure 8:
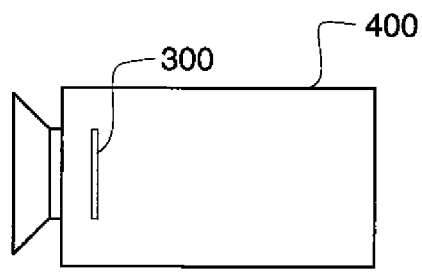
FIG. 8 is a camera having the image sensor of the present invention.

FIG. 8 is a digital camera 400 having the image sensor 300 of the present invention.

The invention has been described with reference to a preferred embodiment. However, it will be appreciated that a person of ordinary skill in the art can effect variations and modifications without departing from the scope of the invention.

PARTS LIST 100 image sensor
105 row decoder circuitry
100 timing generator
115 analog-to-digital converter
120 image processing
125 correlated double sampling (CDS) circuitry
130 photosensitive pixel
150 photodiode
151 photodiode
152 transfer gate
153 transfer gate
154 reset transistor gate
155 floating diffusion
156 output transistor gate
157 output signal line
158 power supply line (VDD)
160 gap
210 output transistor or amplifier
212 reset transistor gate
214 transfer gate
216 transfer gate
218 floating diffusion or sense node
220 output transistor or amplifier
222 reset transistor gate
224 transfer gate
226 transfer gate
228 floating diffusion or sense node
230 switches
231 switches
232 photodiode
233 photodiode
234 power supply line (VDD)
235 pixel
236 pixel
237 photodiode
238 photodiode
240 sink load transistor
241 sink load transistor
242 output signal line
243 output signal line
250 silicon substrate
300 image sensor
305 row decoders
310 timing generator
315 analog-to-digital converter
320 image processor
325 column decoders
330 photosensitive pixels
400 digital camera

What is claimed is:

1. An image sensor comprising:
   (a) a plurality of pixels disposed on a substrate, at least two adjacent pixels comprising:
      (i) at least one photosensitive region that collects charges in response to incident light;
      (ii) a charge-to-voltage conversion node for sensing the charge from the at least one photosensitive region and converting the charge to a voltage;
      (iii) an amplifier transistor having a source/drain connected to an output node, having a gate connected to the charge-to-voltage conversion node and having a source/drain connected to at least a portion of a power supply node; and
      (iv) a reset transistor connecting the output node and the charge-to-voltage conversion node, wherein one pixel includes a sequential spatial order as follows: the charge-to-voltage conversion node, a reset gate of the reset transistor, the output node, the gate of the amplifier transistor and at least a portion of the power supply node and the adjacent pixel includes a sequential spatial order as follows: a remaining portion of the power supply node, the gate of the amplifier transistor, the output node, a reset gate of the reset transistor, and a charge-to-voltage conversion node.

2. The image sensor as in claim 1, wherein the source/drain of the amplifier transistor in the one pixel is connected to one half or substantially one half of the power supply node.

3. The image sensor as in claim 2, wherein the source/drain of the amplifier transistor in the adjacent pixel shares substantially the remaining half of the power supply node.

4. The image sensor as in claim 1, wherein each of the at least two adjacent pixels include at least one a transfer gate for transferring charge from the at least one photosensitive region to the charge-to-voltage conversion node.

5. A camera comprising:
   an image sensor comprising:
   (a) a plurality of pixels disposed on a substrate, at least two adjacent pixels comprising:
      (i) at least one photosensitive region that collects charges in response to incident light;
      (ii) a charge-to-voltage conversion node for sensing the charge from the at least one photosensitive region and converting the charge to a voltage;
      (iii) an amplifier transistor having a source/drain connected to an output node, having a gate connected to the charge-to-voltage conversion node and having a source/drain connected to at least a portion of a power supply node; and
      (iv) a reset transistor connecting the output node and the charge-to-voltage conversion node, wherein one pixel includes a sequential spatial order as follows: the charge-to-voltage conversion node, a reset gate of the reset transistor, the output node, the gate of the amplifier transistor and at least a portion of the power supply node and the adjacent pixel includes a sequential spatial order as follows: a remaining portion of the power supply node, the gate of the amplifier transistor, the output node, a reset gate of the reset transistor, and a charge-to-voltage conversion node.

6. The camera as in claim 5, wherein the source/drain of the amplifier transistor in the one pixel is connected to one half or substantially one half of the power supply node.

7. The camera as in claim 6, wherein the source/drain of the amplifier transistor in the adjacent pixel shares substantially the remaining half of the power supply node.

8. The camera as in claim 5, wherein each of the at least two adjacent pixels include at least one a transfer gate for transferring charge from the at least one photosensitive region to the charge-to-voltage conversion node.

* * * * *